United States Patent [19]
Geary et al.

[11] Patent Number: 6,057,918
[45] Date of Patent: May 2, 2000

[54] LASER TESTING PROBE

[75] Inventors: John Michael Geary, Longswamp Township, Lehigh County; James Kevin Plourde, Allentown, both of Pa.

[73] Assignee: Lucent Technologies, Inc., Murray Hill, N.J.

[21] Appl. No.: 09/013,314

[22] Filed: Jan. 26, 1998

[51] Int. Cl.[7] .................................. G01J 1/42; H01S 3/13
[52] U.S. Cl. ............................................. 356/218; 372/29
[58] Field of Search ................................ 372/29, 31, 32; 356/218

[56] References Cited

U.S. PATENT DOCUMENTS

| | | | |
|---|---|---|---|
| 5,019,769 | 5/1991 | Levinson | 372/29 |
| 5,124,993 | 6/1992 | Braunlich et al. | 372/31 |
| 5,293,216 | 3/1994 | Moslehi | 356/371 |
| 5,402,433 | 3/1995 | Stiscia | 372/31 |
| 5,579,328 | 11/1996 | Habel et al. | 372/31 |
| 5,666,450 | 9/1997 | Fujimura et al. | 385/93 |
| 5,812,572 | 9/1998 | King et al. | 372/26 |

*Primary Examiner*—Frank G. Font
*Assistant Examiner*—Zandra V. Smith

[57] ABSTRACT

A laser test probe is configured to include an electronic probe and a pair of optical fibers. The electronic probe is a high speed transmission line that is used to provide the required bias signal, as well as an RF test signal, to a laser being tested. The optical fibers are used to capture the optical output signals from the front and rear faces of the laser. These optical signals are then analyzed by a measurement control unit to assess the performance of the device under test. In its most basic embodiment, the test probe can be used to identify lasers that exhibit an insufficient (in the extreme, non-existent) optical output signal.

13 Claims, 2 Drawing Sheets

LASER TESTING PROBE

BACKGROUND OF THE INVENTION

1. Field of the Invention

The present invention relates to a laser testing probe and, more particularly, to a probe that is capable of measuring and recording optical power output data for lasers being tested.

2. Description of the Prior Art

In the manufacture of semiconductor laser devices, a number of lasers are simultaneously formed on a semiconductor wafer substrate, then divided (usually cleaved) to form the separate devices. Each device may or may not be bonded onto a chip handler, or carrier. Each individual laser is then tested by establishing electrical contacts to the N and P sides of the device, and the light diverging from the front facet and rear facet is collected by lenses or other light-gathering means. The collected light is then directed onto associated test instruments that evaluate the quality of the laser. The light-gathering means are situated on either side of the laser chip, along the axis of the cavity and are usually located at a substantial distance from the chip. This distance may, at times, interfere with the quality of the test results. Another problem with this conventional test method is that it is extremely time-consuming, requiring that each individual laser chip be mounted and tested individually.

SUMMARY OF THE INVENTION

The present invention relates to a laser testing probe and, more particularly, to a probe that is capable of measuring and recording optical power output data for lasers being processed and tested in wafer form.

In particular, the probe of the present invention comprises an electrical high speed transmission line (electronic probe) for supplying a bias voltage and RF test signal to a laser under test on the wafer, in combination with a pair of optical fibers, the optical fibers disposed on either side of the electronic probe and used to measure the optical signal exiting both the front facet (transmission side) and rear facet (backface) of the laser under test. The applied RF signal may be varied and the optical output power measured accordingly. Conventional optical/electrical conversion means are used to transform the optical output signals into electrical representations that may be stored on a per laser basis.

The probe design of the present invention may therefore be used in a manufacturing environment to "weed out" bad lasers (i.e., those with insufficient optical output) and also allow the optical output power of each individual laser to be recorded, where this information may be important if the lasers are to be used for different applications and the power performance is a determinative factor. Advantageously, the probe may be used on a set of lasers at the wafer level during manufacture, prior to "dicing" the structure into separate laser devices. Any unacceptable devices may then be marked and removed before incurring additional time and expense in packaging these devices.

Various other features of the inventive probe structure will become obvious during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
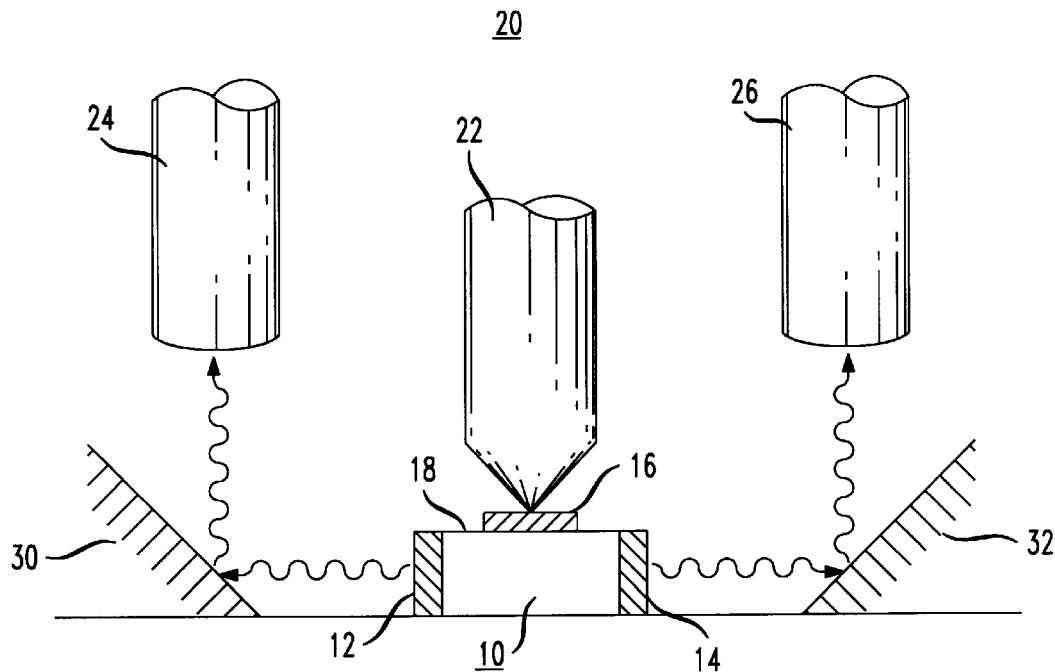
FIG. 1 illustrates an exemplary laser testing arrangement utilizing the laser test probe of the present invention.

FIG. 1 illustrates an exemplary arrangement for testing a semiconductor laser using the laser test probe structure of the present invention. It is to be understood that the test probe may be used to test virtually any type of semiconductor laser, where only the electronic bias and RF signals need to be adjusted to activate the particular device under test. Further, although an individual laser is illustrated, it is contemplated that the probe may be used in associated with a plurality of lasers, such as a wafer-level laser structure, before the individual devices are diced or cleaved. An exemplary laser 10 is shown in FIG. 1 as including an HR-coated rear face 12 and AR-coated front face 14. Laser 10 further includes an electrical contact region 16 disposed on top surface 18 thereof. A test probe 20 of the present invention is disposed above laser 10 and lowered until electronic probe 22 of test probe 20 comes into physical contact with electrical contact region 16. Electronic probe 22 comprises a high speed transmission line (such as a coaxial transmission line) that is capable of supplying both the bias voltage required to activate laser 10, as well as an RF test signal that may be impressed upon laser 10 to measure its response. That is, the RF signal is used as a test "data" signal so that the optical output response of laser 10 may be observed. In particular, the optical output signal from laser 10 is measured using a pair of optical fibers 24 and 26. As shown in FIG. 1 the testing arrangement is configured to include a pair of reflecting surfaces 30 and 32 disposed to intercept the optical power exiting rear face 12 and front face 14, respectively. In particular, the optical output signals from laser 10 will be re-directed by reflecting surfaces 30 and 32 into optical fibers 24 and 26. The optical signals are subsequently transformed into electrical representations that may then be used to analyze the performance of the laser as a function of both the bias signal and applied RF signal.

Figure 2:
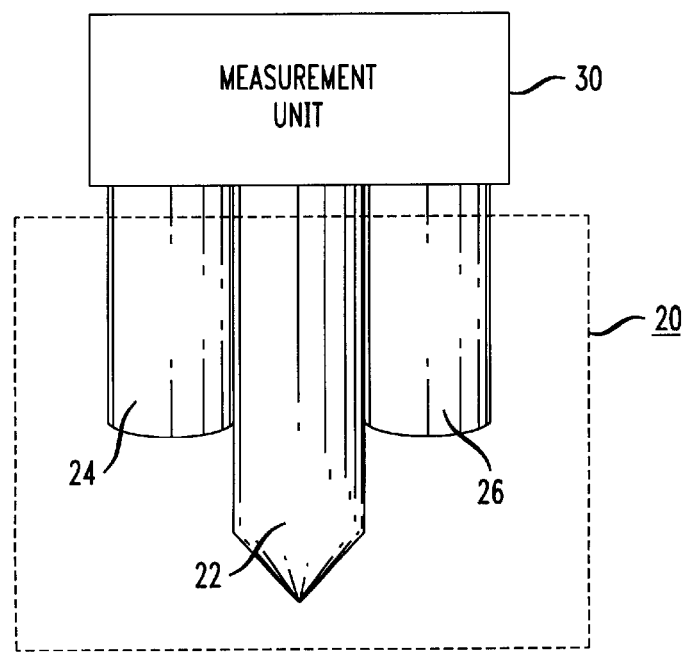
FIG. 2 is a front view of an exemplary laser test probe.

FIG. 2 illustrates an exemplary laser test probe 20 and associated measurement unit 30. The input signal applied to electronic probe 22, as well as the measured output signals along fibers 24 and 26 are coupled to measurement unit 30, where unit 30 is capable of maintaining the data associated with each laser as it is being tested. In its most basic form, measuring unit 30 may function to simply "weed out" bad lasers during the manufacturing process. That is, measurement unit 30 functions to keep track of those lasers that exhibit an inadequate optical output signal. In a more sophisticated system, measurement unit 30 may maintain the optical output data generated for each tested laser as function of bias signal and applied RF signal. This data may be important for identifying lasers that are exceptional performers (for example, in terms of response time, output power level, etc.) and may be required for certain applications. By using the probe of the present invention, each individual laser may be "characterized" and archived for proper use.

Figure 3:
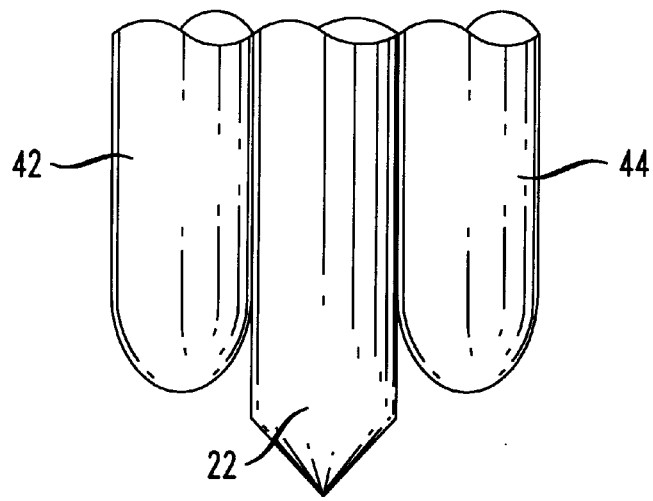
FIG. 3 illustrates an alternative probe configuration utilizing a pair of lensed optical fibers.
Figure 4:
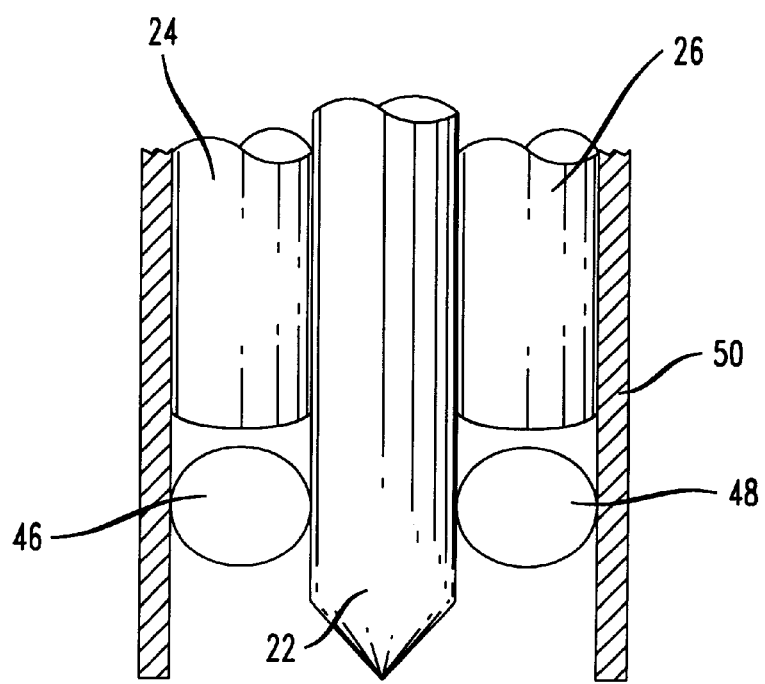
FIG. 4 contains yet another embodiment of the present invention, utilizing separate lensing components in combination with the optical fibers.

It is to be understood that the above-described arrangement is exemplary only and the laser probe of the present invention may be used in other arrangements. For example, it may be necessary for some applications to measure only the optical power exiting the front face of the laser. In that case, the backface power will not be measured and stored Additionally, the optical arrangement can be modified to improve the coupling of the optical signal between the laser and the test probe. For example, lensed optical fibers may be used, such as lens fibers 42 and 44 illustrated in the alternative fiber probe structure of FIG. 3. Alternatively, separate lens elements may be incorporated FIG. 4 illustrates yet another embodiment of the inventive test probe, where a pair of spherical lenses 46 and 48 are positioned at the endface of optical fibers 24 and 26, respectively. A test probe jacket 50 is included in this structure to maintain lenses 46 and 48 in relative alignment with fibers 24 and 26. Various other lensing arrangements are well known in the art and may be used in association with the test probe structure of the present invention. In general, other arrangements are possible and are contemplated to fall within the spirit and scope of the present invention as defined by the appended claims.

What is claimed is:

1. A laser test probe for testing semiconductor lasers in wafer form comprising an electronic probe for providing a bias signal and an RF testing signal to a semiconductor laser, said semiconductor laser defined as including a front, transmission face and a rear, monitor face;

a first optical fiber for intercepting a first optical signal exiting the front, transmission face of said laser, said first optical fiber disposed adjacent to said electronic probe so as to form a portable arrangement; and a measurement unit coupled to the first optical fiber for receiving the first optical signal propagating therealong and assessing the performance of said laser based upon said received first optical signal.

2. A laser test probe as defined in claim 1 wherein the laser test probe further comprises a second optical fiber for intercepting a first optical signal exiting the rear, monitor face of the laser, said second optical fiber also disposed adjacent to said electronic probe with said first optical fiber, the measurement unit coupled to the second optical fiber for receiving the optical signal propagating therealong and assessing the performance of said laser based upon the received first and second optical signals.

3. A laser test probe as defined in claim 2 wherein the bias and RF signals exiting the electronic probe are generated by the measurement unit.

4. A laser test probe as defined in claim 2 wherein the measurement means assesses the laser performance by measuring the output optical signal power level.

5. A laser test probe as defined in claim 2 wherein the first and second optical fibers comprise lensed optical fibers.

6. A laser test probe as defined in claim 2 wherein the test probe further comprises lensing elements disposed between each optical fiber and its associated laser face.

7. A laser test probe as defined in claim 6 wherein spherical lens elements are used.

8. A laser testing arrangement comprising a laser test probe including an electronic probe for provide a bias signal and a RF testing signal to a semiconductor laser;

a first optical fiber for intercepting the optical signal exiting the front, transmission face of said laser;

a second optical fiber for intercepting the optical signal exiting the rear face of said laser; and measurement means coupled to the first and second optical fibers for receiving the optical signals propagating therealong and assessing the performance of said laser;

first reflection means disposed to intercept the optical signal exiting the front face of said laser for redirecting said signal into the first optical fiber; and second reflection means disposed to intercept the optical signal exiting the rear face of said laser for redirecting said signal into the second optical fiber.

9. A laser test arrangement as defined in claim 8 wherein the bias and RF signals exiting the electronic probe are generated by the measurement means.

10. A laser test arrangement as defined in claim 8 wherein the measurement means assesses the laser performance by measuring the output optical signal power level.

11. A laser test arrangement as defined in claim 8 wherein the first and second optical fibers comprise lensed optical fibers.

12. A laser test arrangement as defined in claim 8 wherein the test probe further comprises lensing elements disposed between each optical fiber and its associated laser face.

13. A laser test probe as defined in claim 12 wherein spherical lens elements are used.

\* \* \* \* \*